(12) United States Patent
Quaglietta

(10) Patent No.: US 7,417,508 B1
(45) Date of Patent: Aug. 26, 2008

(54) MULTIPLE RF PATH AMPLIFIERS

(75) Inventor: Anthony F. Quaglietta, Methuen, MA (US)

(73) Assignee: SiGe Semiconductor (U.S.), Corp., Methuen, MA (US)

( * ) Notice: Subject to any disclaimer, the term of this patent is extended or adjusted under 35 U.S.C. 154(b) by 36 days.

(21) Appl. No.: 11/715,382

(22) Filed: Mar. 8, 2007

(51) Int. Cl.
*H03F 3/04* (2006.01)

(52) U.S. Cl. ................ 330/302; 330/305; 330/124 R

(58) Field of Classification Search ........... 330/302, 330/305, 124 R
See application file for complete search history.

(56) References Cited

U.S. PATENT DOCUMENTS

| | | | | |
|---|---|---|---|---|
| 4,910,478 A | * | 3/1990 | Koyama | 330/278 |
| 5,548,246 A | * | 8/1996 | Yamamoto et al. | 330/51 |
| 5,973,557 A | * | 10/1999 | Miyaji et al. | 330/51 |
| 6,927,625 B2 | * | 8/2005 | Yamaguchi | 330/124 R |
| 2003/0155973 A1 | * | 8/2003 | Doi et al. | 330/133 |
| 2007/0096804 A1 | * | 5/2007 | Bakalski | 330/51 |

* cited by examiner

*Primary Examiner*—Patricia Nguyen
(74) *Attorney, Agent, or Firm*—Townsend and Townsend and Crew LLP

(57) ABSTRACT

An amplifier is disclosed for providing processing of a variable RF signal, the amplifier comprising a first parallel gain stage and a plurality of second parallel gain stages electrically disposed between an input fixed impedance matching circuit and an output fixed impedance matching circuit. Wherein in operation each of the first parallel gain stage and plurality of second parallel gain stages are for processing the variable RF signal according to at least a characteristic of the RF power or frequency range. Each of the plurality of second parallel gain stages comprising a tunable impedance matching circuit such that when the second parallel gain stage is in operation the tunable impedance matching circuit providing a transformation of impedance to match between the second amplifier and output fixed matching circuit within the frequency range, and other than providing a match within the frequency range when not in operation.

58 Claims, 8 Drawing Sheets

Fig2:Prior Art Parallel Amplifiers

MULTIPLE RF PATH AMPLIFIERS

FIELD OF THE INVENTION

The invention relates to the field of electronic amplifiers and more particularly to reducing the current consumption of power amplifiers.

BACKGROUND OF THE INVENTION

In recent years, the use of wireless and RF technology has increased dramatically in portable and hand-held units, where such units may be deployed by a variety of individuals from soldier on the battlefield to a mother searching for her daughter's friend's house. The uses of wireless technology are widespread, increasing, and include but are not limited to telephony, Internet e-mail, Internet web browsers, global positioning, photography, and in-store navigation.

Within each hand-held or portable wireless device there is a highly sensitive chain of RF electronics providing both the transmission and receiver functions. These circuits require not only direct manipulation of the RF signal, for example by amplification, attenuation, mixing or detection, but also ancillary functions such as power monitoring, signal identification, and control. Additionally these functions may be undertaken post-mixing, such that the signals are at a lower RF frequency (typically called the IF or Intermediate Frequency) than the original received signal.

Increasingly therefore such wireless electronics must provide simultaneous optimization of the function at lowest cost whilst also offering:

Wide dynamic range for maximum coverage from wireless infrastructure,
Flexible operation at high and low power levels for transmit and receive functions in same wireless device,
Operation on multiple frequencies to provide single wireless device with widest coverage against multiple worldwide standards, and
Low power consumption under all conditions to provide maximum standby and use times for user.

In today's commercially demanding requirements for providing highly adaptive amplification within wireless devices, with multiple frequency regimes, multiple international protocol standards, widely ranging microwave signal levels and the commercial benefits of achieving these in wireless devices with smaller physical size, using lower cost components, which leads to minimizing die footprint on semiconductor manufacturing techniques.

It would be advantageous to provide for a design solution for microwave amplifiers exploiting parallel gain circuits to supports these demands, whilst reducing power consumption, thereby providing for increased battery lifetime.

It would be further advantageous if the approach provided for a solution that allowed for increased semiconductor integration by reducing number and/or type of elements required, provided enhanced manufacturing efficiency and eliminating a need for a large quantity of bulky discrete external components.

SUMMARY OF THE INVENTION

In accordance with the invention there is provided a microwave amplifier for amplifying RF signals which comprises an input port, the input port receiving a variable RF signal for amplification and comprising signals corresponding to a predetermined set of frequencies. The microwave amplifier comprises an output port for providing an amplified version of the variable RF signal. Disposed between the input and output ports of the RF amplifier is a for amplifying the variable RF signal, the circuit comprises an input fixed impedance matching circuit, an output fixed impedance matching circuit and a first amplifier disposed electrically between the input fixed impedance matching circuit and the input impedance port of the output fixed impedance matching circuit. The first amplifier comprises a front port for receiving at least a portion of the variable RF signal, a back port for providing an amplified version of the at least a portion of the variable RF signal, and a first gain circuit for providing an amplification of the at least a portion of the variable RF signal.

The circuit further contains at least one of a plurality of second amplifiers disposed electrically between the input fixed impedance matching circuit and output fixed impedance matching circuit, where the plurality of second amplifiers are other than electrically connected in series with the first amplifier. Each of the plurality of second amplifiers comprises a first port for receiving at least a portion of the variable RF signal, a second port for providing an amplified version of the at least a portion of the variable RF signal, a second gain circuit for providing an amplification of the at least a portion of the variable RF signal, and a tunable impedance matching circuit for providing a transformation of impedance from the output impedance of the output port of the second amplifier to the impedance of the input impedance port of the output fixed impedance matching circuit.

In accordance with another embodiment of the invention there is provided a method of amplifying a variable RF signal comprising the following steps:

(a) providing a first amplifier circuit for performing a first amplification function and responsive to at least a first control signal, the first amplifier circuit having a first operating characteristic, an input fixed impedance matching circuit, an output fixed impedance matching circuit, and a first gain stage disposed electrically between the input fixed impedance matching circuit and output fixed impedance matching circuit;

(b) providing at least of a plurality of second amplifier circuits, each of the plurality of second amplifier circuits for performing a second amplification function and responsive to at least a second control signal and an impedance control signal, the second amplifier circuit having a second operating characteristic, a second gain stage and a tunable impedance matching circuit; wherein the second gain stage is disposed electrically between the input fixed impedance matching circuit and output fixed impedance matching circuit, and the tunable impedance matching circuit for providing a transformation of impedance from the second amplifier to the impedance of output fixed impedance matching circuit.

(c) providing the variable RF signal to an input port of the input fixed impedance matching circuit, the variable RF signal comprising signals corresponding to a predetermined set of frequencies;

(d) determining which one of first amplifier circuit and one of the plurality of second amplifier circuits is required to provide the required amplification of the variable RF signal;

(e) providing to the first amplifier circuit at least a first control signal when the first amplifier circuit is in operation, and other than a first control signal when the first amplifier circuit is other than in operation;

(f) providing to each second amplifier circuit of the plurality of second amplifier circuit at least a second control signal when the second amplifier circuit is in operation, and other than a second control signal when the second amplifier circuit is other than in operation;

(g) providing to each second amplifier circuit a first impedance control signal when the second amplifier circuit is in operation, and a second impedance control signal when the second amplifier circuit is other than in operation, and (h) generating an amplified variable RF signal at an output port of the output fixed impedance matching circuit, the amplified variable RF signal being related to the variable RF signal and at least one of the first operating characteristic and second operating characteristic.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
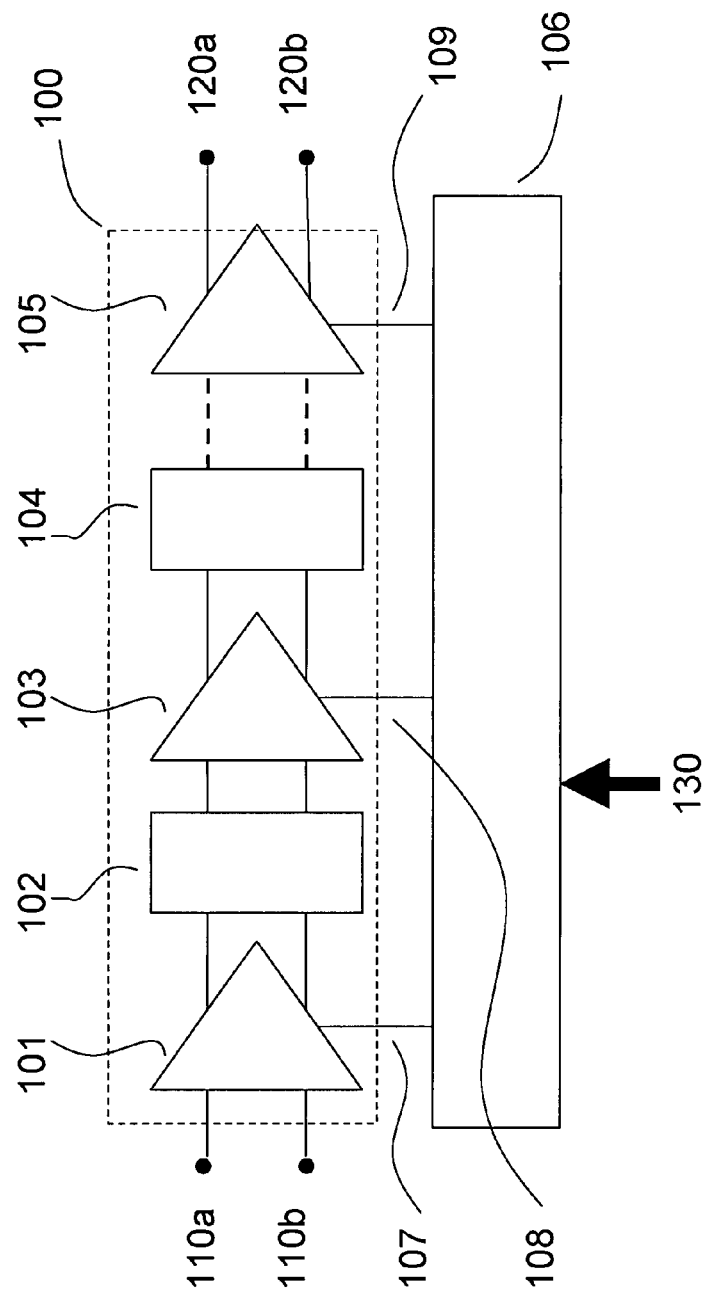
FIG. 1 is a simplified schematic of a typical prior art switchable gain amplifier after Hu et al (U.S. Pat. No. 5,977,828) using serially cascaded amplifier stages.

Multiple solutions have been exploited in the prior art addressing the above noted issues. FIG. 1 shows a prior art amplifier of Hu et al (U.S. Pat. No. 5,977,828) "Multiple-Tail Transconductance Switchable Gain Amplifier." Here, the RF amplifier is intended to process signals of different strengths, which can arise from a multitude of sources including but not limited to changing weather conditions, rapid movement of source/receiver relative to one another, switching between multiple sources at varying distances as the user crosses cellular cell boundaries, switching from one international standard to another be it in frequency or encoding, and alternating between transmit mode and receive mode of a single microwave electronics infrastructure within the wireless device.

Shown in FIG. 1 is a simplified schematic of an adjustable gain amplifier employing a serial cascade of amplifiers. This example, represents a common class of dynamic amplifiers wherein output power of the microwave amplifier 100 is adjusted in response to control signals provided to a bias control circuit 106 for adjusting the operating point of the multiple amplifier gain stages 101, 103 and 105 accordingly to adjust the output power.

The microwave amplifier 100 is electrically coupled to a preceding microwave element of a microwave circuit or network (not shown) and receives, at its input ports 110a and 110b, a microwave signal for operation thereupon. The received microwave signal is then applied to a plurality of microwave circuit elements arranged in series. The output signal from this cascaded plurality of microwave circuit elements is provided as an output microwave signal at the output ports 120a and 120b of the microwave amplifier 100. Said output ports 120a and 120b are electrically coupled to a subsequent microwave circuit element or network element (not shown).

The serial cascade is shown as three amplifier gain stages, 101, 103 and 105 alternately interspersed with additional microwave circuit elements 102 and 104. These elements may be for DC level shifting the output signal of the amplifier gain stages 101 and 103 as taught by Hu et al or they may alternatively be, as taught in Yeh (U.S. Pat. No. 5,995,814) passband filtering elements.

Each of the amplifier gain stages, 101, 103 and 105 is electrically coupled via control signal lines 107 to 109 to the bias control circuit 106. As shown, control signal line 107 addresses solely amplifier gain stage 101, and similarly control signal line 108 addresses solely amplifier gain stage 103, and finally control signal line 109 addresses the final amplifier gain stage 105. The bias control circuit is electrically coupled to an overall amplifier control circuit (not shown) at its control port 130.

The bias control circuit 106 interprets the control signal applied at the control port 130 for the required amplification setting of the microwave amplifier 100. This results in the control signals being applied to control signal lines 107 to 109 such that the microwave amplifier 100 performs as defined within the overall microwave network. Optionally, the control signals applied to the different control signal lines 107 to 109 vary together, in a predefined relationship or sequence. This approach provides for prior art amplifiers with wide dynamic range in a single microwave amplifier. That is, the output signal power level of amplifier can be controlled over a wide range of values.

Figure 2:
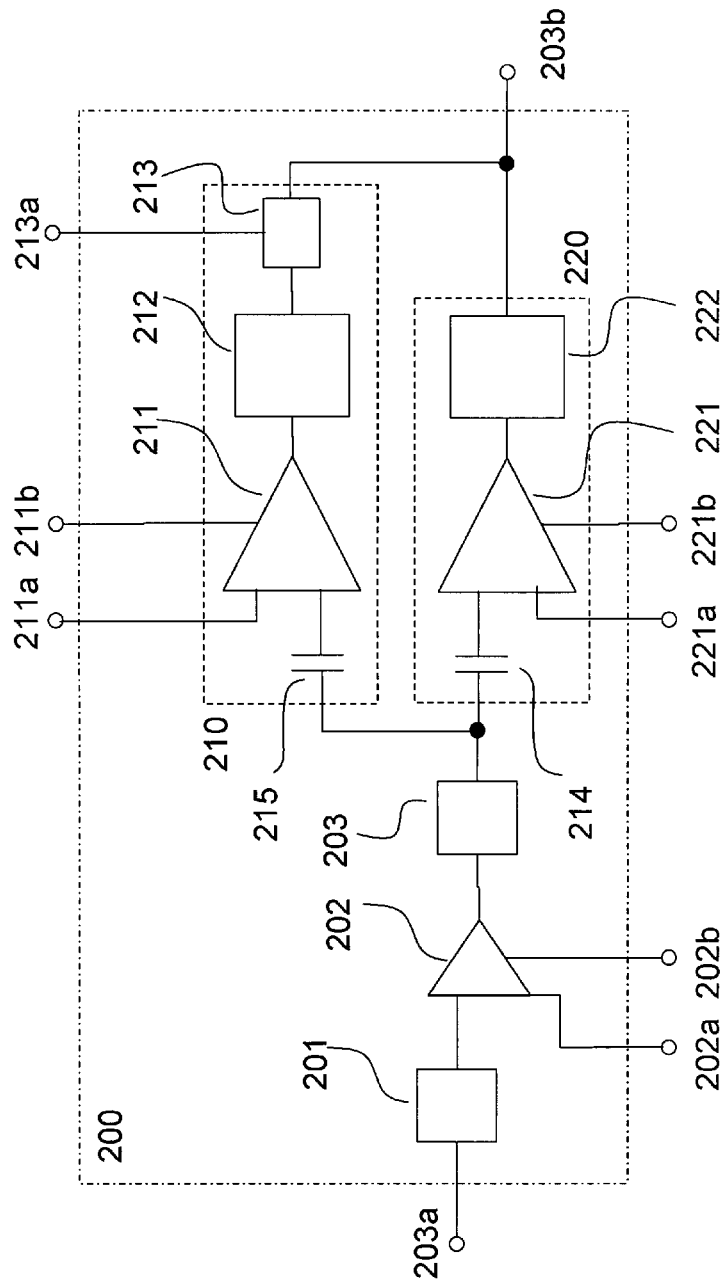
FIG. 2 is a simplified schematic of a prior art amplifier employing parallel amplifier stages after Yamamoto (U.S. Pat. No. 5,548,246).

A second approach is to arrange multiple amplifier gain stages in parallel. Here, typically each amplifier is designed to operate on separate microwave frequency ranges, or to operate in a different manner for a common microwave frequency range. In FIG. 2 shown is such an approach after Yamamoto et al (U.S. Pat. No. 5,548,246) "Power Amplifier Including an Impedance matching Circuit and a Switch FET." Here, the amplifier is designed to provide two different gain settings for a common frequency range such that, for example when the amplifier is a common element to both transmit and receiver circuit paths the amplifier operates in a first "receive" mode such that the amplifier provides a high gain and low output power, and in a second "transmit" mode the amplifier provides low gain with high output power.

Shown in FIG. 2 is a microwave amplifier 200, which receives at an input port 203a a microwave signal for processing and provides the processed microwave signal at its output port 203b. Electrically coupled to the input port 203a is a first fixed microwave impedance matching circuit, ensuring an impedance match between the input port 203a and subsequent first stage amplifier 202. The first stage amplifier 202 is controlled by two control signals applied at control ports 202a and 202b. The output signal from the first stage amplifier 202 is then electrically coupled to a second fixed impedance matching circuit 203 prior to being split and coupled to two parallel sections of the second gain stage, 210 and 220, respectively, wherein each is coupled via a DC decoupling capacitor 214 and 215 respectively.

The lower section 220 of the second gain stage comprises in series a first amplifier gain block 221 coupled to a third fixed impedance matching circuit 222 prior to being coupled to the output port 203b of the microwave amplifier 200. Control of the lower section 220 being via the control ports 221a and 221b.

The upper section 210 of the second gain stage comprises, in series, a second amplifier gain block 211, a fourth fixed impedance matching circuit 212 and an electrical switch 213, an output port of which is coupled to the output port 203b of the microwave amplifier 200. Control of the upper section 210 is via the control ports 211a and 211b to the second amplifier gain block 211 and 213a and to the electrical switch 213. As taught by Yamamoto, the two parallel sections 210 and 220 of the second gain stage are each designed for high efficiency operation at different output powers for input signals within a same input power range. As such, the approach described by Yamamoto et al of using parallel amplifiers provides output powers at different power levels, e.g. 1 W and 10 mW as presented within the figures of Yamamoto et al.

Figure 3A:
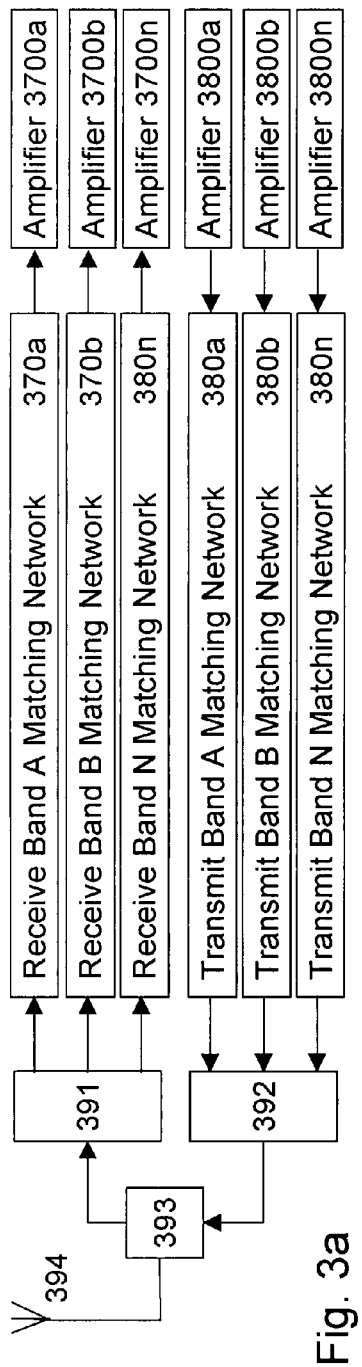
FIG. 3a is a simplified schematic of a prior art cellular amplifier using multiple tunable matching networks and amplifiers for receive and transmit paths after Dent et al (U.S. Pat. No. 6,961,368).
Figure 3C:
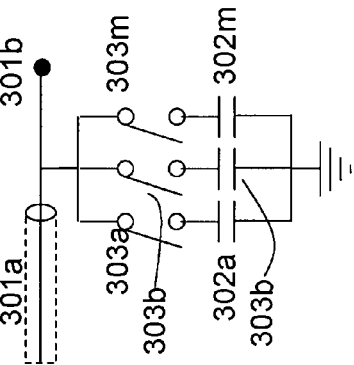
FIG. 3c is a simplified schematic of a prior art adjustable matching network as employed in FIG. 3b.
Figure 3B:
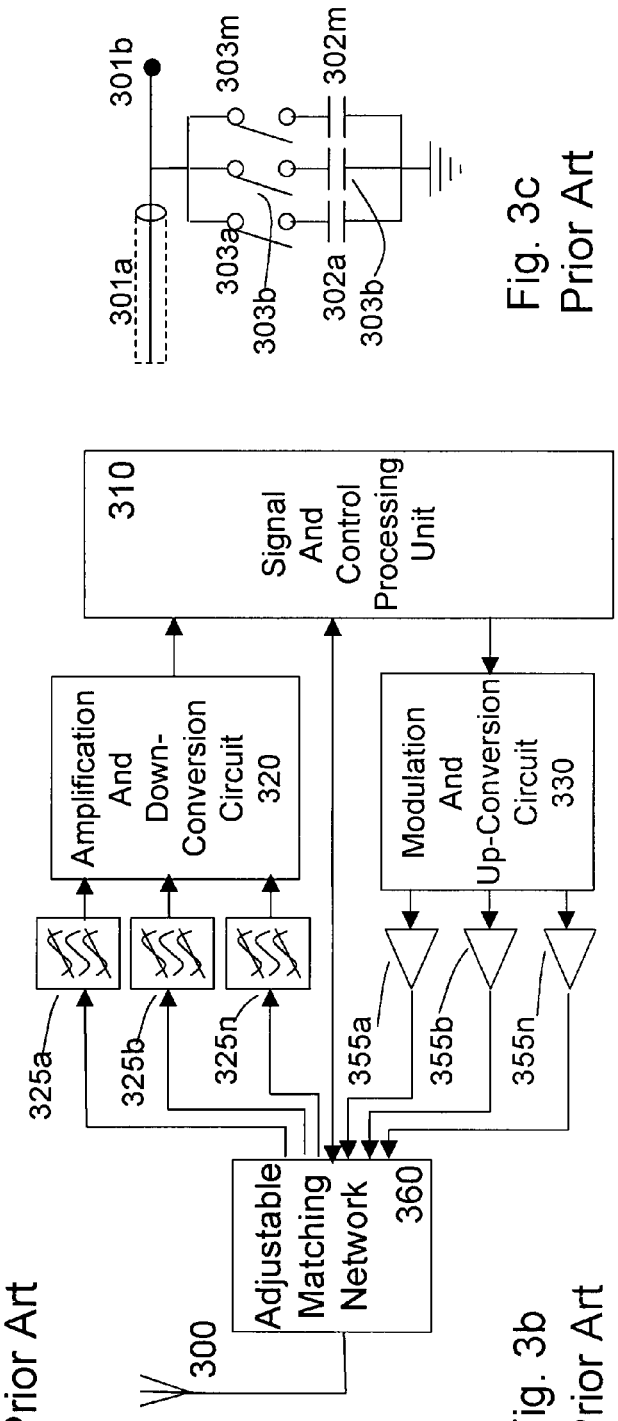
FIG. 3b is a simplified schematic of a prior art transmitter and receiver chain for a prior art cellular amplifier using a single adjustable matching network immediately prior to the antenna.

Addressing the third aspect at issue for designers of microwave electronics for wireless applications is the prior art of Dent et al, which is shown in FIGS. 3a, 3b and 3c. Here the requirement for a bi-directional multi-frequency wireless device, such as a cellular telephone operating on the GPRS and GSM standards with four frequency regimes, 850 MHz, 950 MHz, 1850 MHz and 1950 MHz, results in the prior art solutions typically exploiting multiple independent, albeit parallel amplifiers, giving rise to the problem of matching the circuits to the output antenna over both power and frequency.

As noted, above the approach of Yamamoto, wherein upper section 210 is operating at say 850 MHz and 950 MHz, whilst the lower section 220 is operating at the 1850 MHz and 1950 MHz bands is suitable for this purpose. Here the first amplifier gain stage is a broadband pre-amplifier operating over all bands.

FIG. 3A is therefore essentially an expansion of Yamamoto. Shown in the lower portion are multiple amplifiers 3800a to 3800n for the transmit path that are electrically coupled to fixed transmit matching networks 380a to 380n prior to their connection to a first electrical switch 392, which defines the path in operation, and the second electrical switch 393 prior to being coupled to the antenna 394. The second electrical switch provides for selection of the wireless devices mode of operation as transmitter or receiver.

In receive mode, the received electrical signal from the antenna 394 is coupled by second electrical switch 393 to the receiver selector 391. The receiver selector 391 is coupled to the multiple receiver paths comprising fixed receiver matching networks 370a to 370n followed by the receiver amplifiers 3700a to 3700n. In this teaching of Dent et al each frequency band and operating power regime of the wireless device is addressed with a specific fixed matching network, which Dent et al state is "typically not more complicated than a single series inductor and a shunt capacitor" (U.S. Pat. No. 6,961,368 Col. 9 Lines 43 to 45).

FIG. 3B shows a slightly modified solution to that shown in FIG. 3A where an attempt to reduce footprint by reducing the number of required matching circuits, and hence reduce a number of external capacitors. Shown here, the transmit signal provided by the signal and control processing unit 310 is electrically coupled to the modulation and up-conversion circuit 330 which provides for the modulation of the appropriate local oscillator prior to propagating the signal forward to the array of transmit amplifiers 355a to 355n. Each transmit amplifier 355a to 355n is electrically coupled to the adjustable matching network 360 prior to connection to the antenna 300.

In receiver mode the microwave signal received at the antenna 300 is electrically coupled to the adjustable matching network 360 and then coupled to the array of receiver filters 325a to 325n. Each of the receiver filters 325a to 325n is coupled to the amplification and down conversion circuit 320 boosting the received signal, mixing the microwave signal to an intermediate frequency, and propagating forward of this down-converted signal to the signal and control processing unit 310.

Within adjustable matching network 360 are an adjustable matching circuit, which is not taught, and electrical switching elements necessary to select or address only one of the multiple paths within the circuitry. In each specific mode of operation the adjustable matching circuit provides solely for the matching of the selected transmit/receive circuit to the antenna. As taught by Dent et al, such an adjustable matching network, as shown in FIG. 3c, consists of a section of transmission line 301a capacitively coupled by one of a plurality of capacitors 302a to 302m to ground. The matching is adjusted by selecting which of the plurality of capacitors 302a to 302m is coupled by the plurality of electrical switches 303a to 303m.

Figure 4:
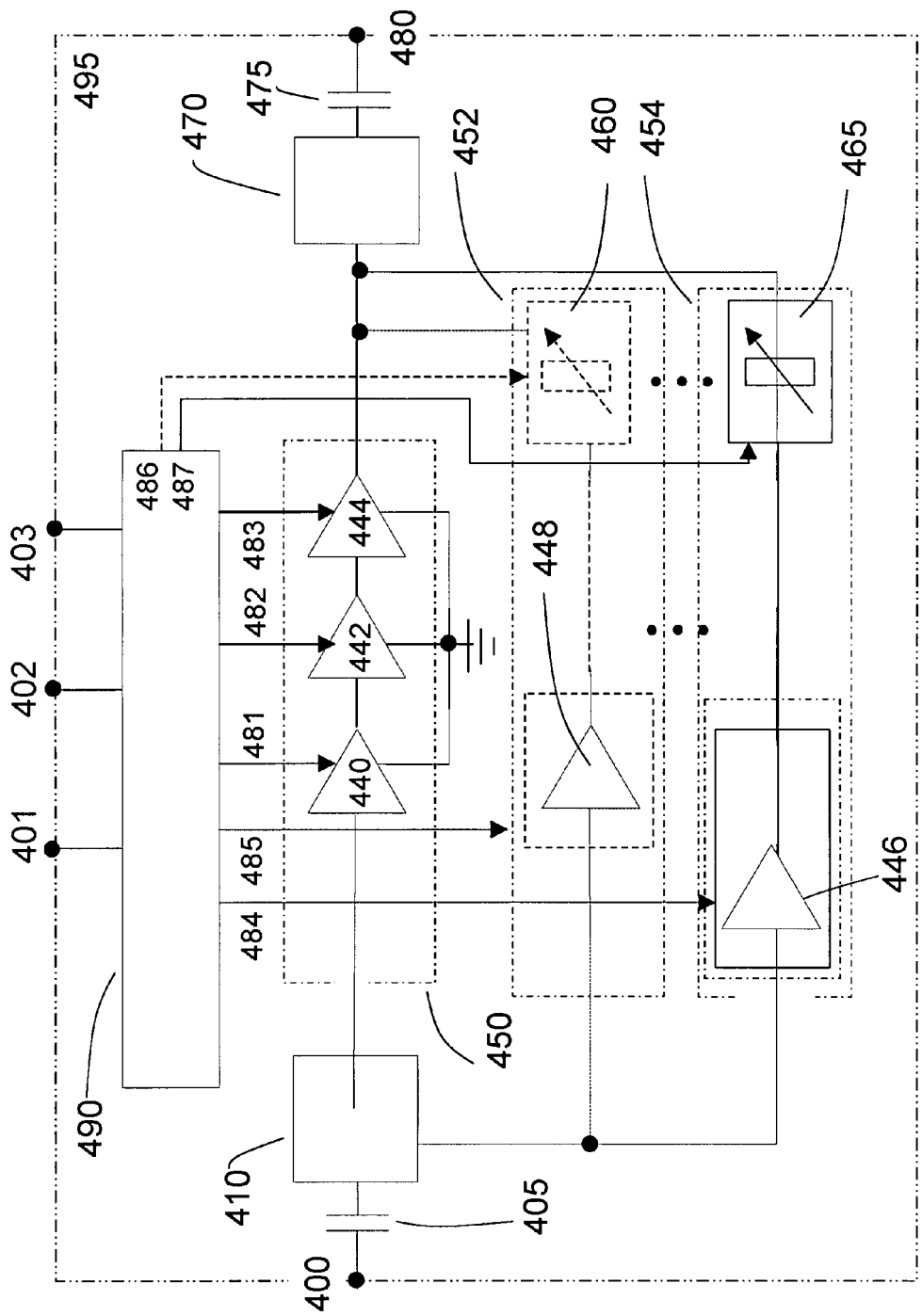
FIG. 4 is a simplified schematic of a first embodiment of the invention of parallel amplifiers with tunable impedance matching and dynamic power management and electrical selection of amplifier stage.

FIG. 4 is a simplified schematic of a first embodiment of the invention wherein a microwave circuit is composed of a series of parallel amplifiers, where a first amplifier 450 is disposed between a fixed input matching circuit 410 and a fixed output matching circuit 470, and the other parallel amplifiers comprise tunable impedance matching circuits for selectively matching or mismatching these paths to the fixed output matching circuit 470.

Shown is a microwave amplifier 495 electrically coupled to a microwave network via microwave input port 400 and microwave output port 480. The microwave input port 400 is capacitively coupled, via capacitor 405, to a fixed input matching circuit 410, thereby providing for decoupling of DC components in the received microwave signal at microwave input port 400. The fixed input matching circuit is electrically coupled to a plurality of parallel amplifiers 450 to 454. Optionally, the electrical coupling comprises a passive splitter network, when the amplifiers are intended to operate on the same frequency band, or, alternatively a filtering network, when the amplifiers are intended to operate at different frequency bands. Other embodiments will be evident to one skilled in the art for providing alternative coupling of the fixed input matching circuit 410 to the plurality of amplifiers 450 to 454 according to design specifications for operation of the overall microwave amplifier 495.

While the embodiment shown has three parallel amplifiers, the described approach functions for any number M of parallel amplifiers, where $M \geq 2$.

Considering the first parallel amplifier 450, this is implemented in three cascaded gain stages 440, 442, and 444, which are electrically coupled in series. The input port of the first gain stage 440 is electrically coupled to an output port of the input fixed matching circuit 410, and the output port of the third gain stage 444 is coupled to an input port of the fixed output matching circuit 470. The fixed output matching circuit is implemented with a single input port if the parallel amplifier output ports are combined prior, or in a similar manner to 410 with additional microwave circuitry if combined at the fixed output matching circuit 470.

Each gain stage 440 to 444 is also electrically coupled to the bias for enabling control circuit 470 through the bias control lines 481 to 483. The bias control lines 481 to 483 provide bias control signals appropriate to each of the gain stages 440, 442 and 444, respectively, and thereby adjust performance of the first parallel amplifier 450 in accordance to the amplifier control signals received at input ports 401 to 403 of the microwave amplifier 495. Hence, when biased the first parallel amplifier 450 acts as a variable gain amplifier electrically coupled to the outside microwave network by the fixed input matching circuit and the fixed output matching circuit.

Now considering the second parallel amplifier 454, this is implemented, in the embodiment shown, as a single gain stage 446 in conjunction with a first tunable matching circuit 465. The input port of the single gain stage 446 is electrically coupled to the output port of the fixed input matching circuit 410, and the output port of the single gain stage is electrically coupled to the input port of the first tunable matching circuit 465. The output port of the first tunable matching circuit 465 is electrically coupled to the fixed output matching circuit 470. Electrical control of the second parallel amplifier 454, as shown, comprises a bias control line 484 coupled to the single gain stage 446 and an impedance tuning control line 487 coupled to the first tunable matching circuit 465.

Also shown in FIG. 4 is a third parallel amplifier, in dashed elements, which represents one of a plurality of additional parallel amplifiers that optionally form part of the overall amplifier 495. The third parallel amplifier 452 comprises a single gain stage 448 electrically coupled to a second tunable matching circuit 460. The input port of the single gain stage 448 is electrically coupled to the output port of the fixed input matching circuit 410, and the output port of the single gain stage is electrically coupled to the input port of the second tunable matching circuit 460. The output port of the second tunable matching circuit 460 is electrically coupled to the fixed output matching circuit 470. Electrical control of the second parallel amplifier 452 comprises a bias control line 485, coupled to the single gain stage 448, and an impedance tuning control line 486, coupled to the first tunable matching circuit 460.

In operation, the amplifier is controlled through the digital bias and enable logic block 490, which receives external input signals at amplifier control ports 401 to 403. For example, these external input signals are an overall amplifier enable signal at amplifier control port 401, a power supply at amplifier control port 403, and a control command at amplifier control port 402. The control command is, for example, representative of the frequency band of operation. Alternatively, the control command is indicative of a power range. Of course, other command structures are possible, as are configurations of amplifier control ports, including their elimination and replacement with internal control and decision circuitry such as automatic detection of frequency, power, modulation format, and so forth.

Based upon the control commands the digital bias and enable logic block 490 determine which of the amplifiers to enable, thereby configuring the amplifier bias control lines 481 to 485 appropriately, and determines the signals applied to the impedance tuning control lines 486 and 487. Consider a scenario where the control command received at amplifier control port 402 is one that determines only the second parallel amplifier to be in operation, and that the amplifier is populated with the third parallel amplifier 452.

As such the bias control lines 481 to 483 of the first parallel amplifier 450 are driven to a zero bias state, as is the bias control line 485 of the third parallel amplifier 452. The bias control line 484 for the second parallel amplifier 454 is active and adjusted in response to the command control signal at the amplifier control port 402. Additionally the impedance tuning control line 486 for the third parallel amplifier 452 is set to an "OFF" level establishing an impedance Z1 for the second tunable matching element 460. This impedance Z1 is such that combination of the second tunable matching element 460 and the fixed output impedance match 470 results in a poor impedance match both within the frequency band of interest and outside the frequency band of interest.

The impedance tuning control line 487 for the active second parallel amplifier 454 is set to an "ON" level establishing an impedance Z2 for the first tunable matching element 465. This impedance Z2 is such that combination of the first tunable matching element 465 and the fixed output impedance match 470 results in a good impedance match between the amplifier 454 and the fixed output impedance match 470 within the frequency band of interest, and presents a poor impedance match outside the frequency band of interest, effectively blocking harmonics from exiting the second amplifier 454 or trying to enter the second amplifier 454 backwards from subsequent circuit elements coupled to the output port 480.

Each of the tunable matching elements 460 and 465 is operated between two impedance states, based upon whether the amplifier is active or inactive, in a discrete manner. Alternatively, multiple states and further alternatively analog variations are implemented. Further alternatively, a limited analog variation to an "ON" discrete state is employed to provide for dynamic impedance matching based upon provision of a feedback signal from monitoring circuits such as transmitted power, reflected power, VSWR ratio etc.

Figure 5:
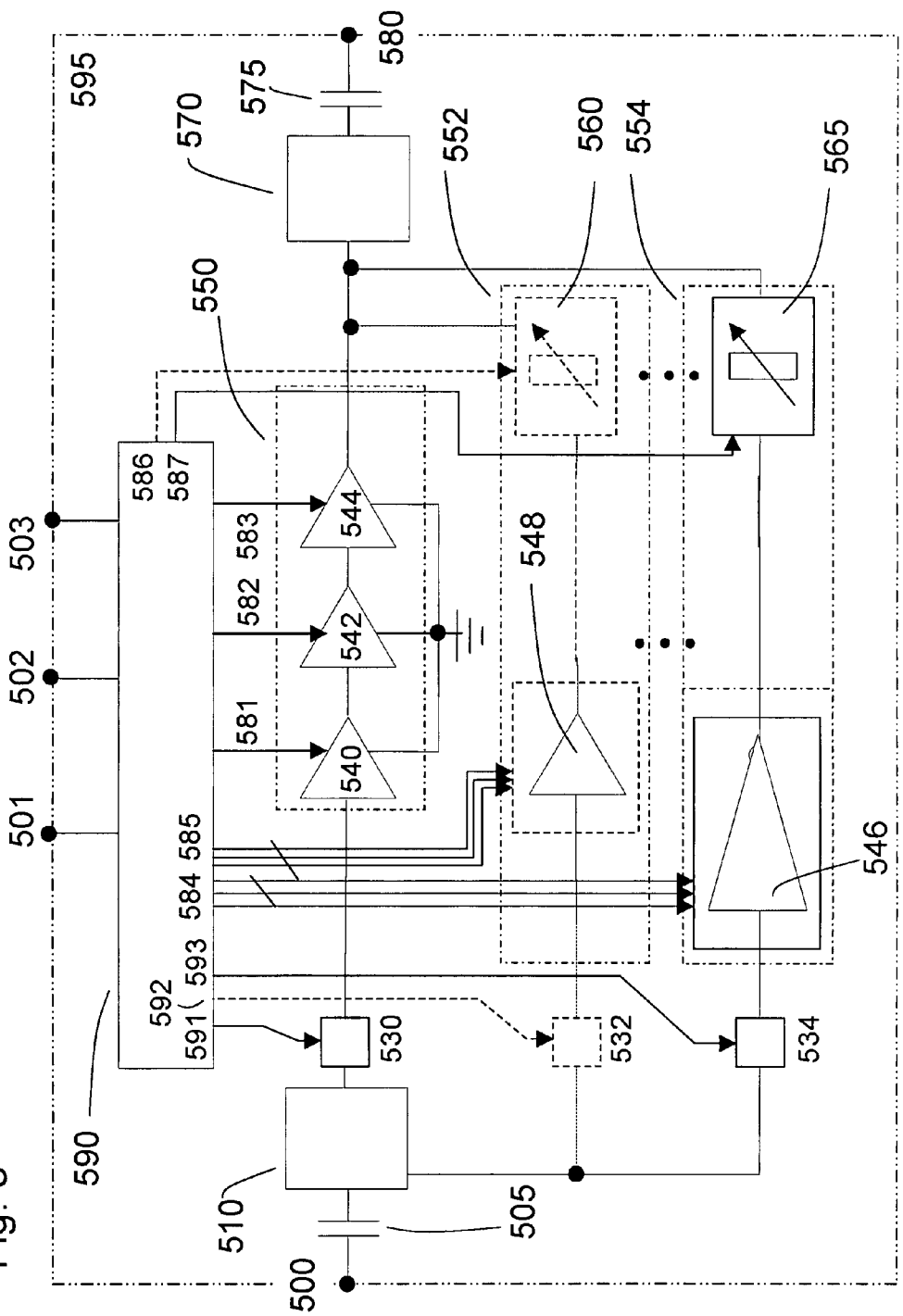
FIG. 5 is a simplified schematic of a second embodiment of the invention using parallel amplifiers with tunable impedance matching, dynamic power management and enhanced isolation of amplifier paths with electrical switching.

FIG. 5 is a simplified schematic of a second embodiment of the invention wherein a microwave circuit is composed of a series of parallel amplifiers, where a first amplifier 550 is disposed between a fixed input matching circuit 510 and a fixed output matching circuit 570, and has a switching circuit 530. The other second and third parallel amplifiers 552 and 554 respectively further comprise tunable impedance matching circuits for selectively matching or mismatching these paths to the fixed output matching circuit 570, together with switching circuits 532 and 534.

Shown is a microwave amplifier 595 electrically coupled to a wider microwave network via the microwave input port 500 and microwave output port 580. The microwave input port 500 is capacitively coupled, via capacitor 505, to a fixed input matching circuit 510 thereby providing for decoupling of DC components in a received microwave signal at microwave input port 500. The fixed input matching circuit is electrically coupled to a plurality of parallel amplifiers 550 to 554. The electrical coupling is optionally a passive splitter network, when the amplifiers are intended to operate on the same frequency band, or alternatively a filtering network, when the amplifiers are intended to operate within different frequency bands. Other embodiments are supported for providing alternative coupling of the fixed input matching circuit 510 to the plurality of amplifiers 550 to 554 according to a specified mode of operation of the overall microwave amplifier 595.

While the embodiment shown has three parallel amplifiers, the approach functions for any number M of parallel amplifiers, where M≧2.

Considering the first parallel amplifier 550, this is shown implemented in three cascaded gain stages 540, 542, and 544, which are electrically coupled in series. The input port of the first gain stage 540 is electrically coupled to the output port of the first switch circuit 530 having an input port thereof electrically coupled to an output port of the input fixed matching circuit 510. The output port of the third gain stage 544 is coupled to an input port of the fixed output matching circuit 570. The fixed output matching circuit is implemented with a single input port when the parallel amplifier output signals are combined prior, or in a similar manner to that 510 with additional microwave circuitry if combined at the fixed output matching circuit 570.

Each gain stage 540 to 544 is also electrically coupled to the bias and enable control circuit 590 via the bias control lines 581 to 583. The bias control lines 581 to 583 provide bias control signals appropriate to each of the gain stages 540, 542 and 544, respectively, and thereby adjust performance of the first parallel amplifier 550 in accordance to the amplifier control signals received at input ports 501 to 503 of the microwave amplifier 595. The final control line of the first parallel amplifier stage comprises the switch control line 591 coupled to the first switch circuit 530.

Hence when biased, the first parallel amplifier 550 acts as a tunable gain amplifier electrically coupled to the wider microwave network by the fixed input matching circuit and the fixed output matching circuit.

Now considering the second parallel amplifier 554 shown implemented as a single gain stage 546 in conjunction with a first tunable matching circuit 565 and a second switch circuit 534. The input port of the single gain stage 546 is electrically coupled to the output port of the second switch circuit 534, which has its input port electrically coupled to the output port of the fixed input matching circuit 510, and the output port of the single gain stage is electrically coupled to the input port of the first tunable matching circuit 565. The output port of the first tunable matching circuit 565 is electrically coupled to the fixed output matching circuit 570. Electrical control of the second parallel amplifier 554 comprises bias control lines 584 coupled to the single gain stage 546, an impedance tuning control line 587 coupled to the first tunable matching circuit 565, and a switch control line 593 coupled to the second switch circuit 534. The bias control lines 584 actively control the effective area of the transistors within the single gain stage 546.

Also shown in FIG. 5 is a third parallel amplifier, in dashed elements, representing one of a plurality of additional parallel amplifiers that are optionally part of the overall amplifier 595. The third parallel amplifier 552 comprises a single gain stage 548 electrically coupled to a second tunable matching circuit 560 and a second switch circuit 532. The input port of the single gain stage 548 is electrically coupled to the output port of the third switch circuit 532, which has its input port electrically coupled to an output port of the fixed input matching circuit 510. The output port of the single gain stage 548 is electrically coupled to the input port of the second tunable matching circuit 560. The output port of the second tunable matching circuit 560 is electrically coupled to the fixed output matching circuit 570.

Electrical control of the third parallel amplifier 552 comprises bias control lines 585 coupled to the single gain stage 548 and an impedance tuning control line 586 coupled to the first tunable matching circuit 560. Additionally, the switch control line 592 is electrically coupled to the third switch circuit 532. The bias control lines 585 actively control the effective area of the transistors within the single gain stage 548.

In operation, the amplifier is controlled through digital bias and enable logic block 590, which receives external input signals at amplifier control ports 501 to 503. For example, these external input signals are optionally an overall amplifier enable signal at amplifier control port 501, a power supply signal at amplifier control port 503, and a control command at amplifier control port 502. For example, the control command is representative of the frequency band of operation. Alternatively, the command control is indicative of a power range. Of course, other command structures are possible, as are other configurations of amplifier control ports including their elimination and replacement with internal control and decision circuitry such as automatic detection of frequency, power, or modulation format.

Based upon the control commands, the digital bias and enable logic block 590 determines which amplifiers to enable, thereby configuring the amplifier bias control lines 581 to 585 appropriately, and determines signals applied to the impedance tuning control lines 586 and 587. When the control command received at amplifier control port 502 is one that indicates the second parallel amplifier 554 is in operation and that the amplifier is actually populated with the third parallel amplifier 552, the bias control lines 581 to 583 of the first parallel amplifier 550 are driven to a zero bias state, as are the bias control lines 585 of the third parallel amplifier 552. The bias control lines 584 for the second parallel amplifier 554 are active and driven to an appropriate bias state, and adjusted in response to the command control signal at the amplifier control port 502. Further, the switch control lines 591 and 592 are set to "OPEN" such that the switch circuits 530 and 532 are open electrically disrupting the signal paths between the fixed input matching circuit 510 and the first and third parallel amplifiers 550 and 552. The switch control line 593 is set to "CLOSED" such that the switch circuit 534 is closed electrically and provides a signal flow path between the fixed input matching circuit 510 and the second parallel amplifier 554.

Additionally the impedance tuning control line 586 for the third parallel amplifier 552 is set to an "OFF" level establishing an impedance Z1 for the second tunable matching element 560. This impedance Z1 is such that combination of the second tunable matching element 560 and the fixed output impedance match 570 results in a poor impedance match both within the frequency band of interest and outside the frequency band of interest.

The impedance tuning control line 587 for the active second parallel amplifier 554 is set to an "ON" level establishing an impedance Z2 for the first tunable matching element 565. This impedance Z2 is such that combination of the first tunable matching element 565 and the fixed output impedance match 570 results in a good impedance match between the amplifier 554 and the fixed output impedance match 570 within the frequency band of interest, and presents a poor impedance match outside the frequency band of interest, effectively blocking harmonics from exiting the second amplifier 554 or trying to enter the second amplifier 554 backwards from subsequent circuit elements coupled to the output port 580.

Each of the tunable matching elements 560 and 565 is operated between two impedance states in a discrete manner, but it would be evident to one skilled in the art that multiple states and even an analog manner are supported. Equally, a limited analog variation of the "ON" discrete state is employable to provide for dynamic impedance matching based upon provision of a feedback signal from monitoring circuits monitoring parameters such as transmitted power, reflected power, and VSWR ratio.

The switch circuits 530 to 534 provide enhanced isolation of the "OFF" paths between the input and output fixed matching circuits 510 and 570 respectively. It will be evident to one skilled in the art that other embodiments are implementable wherein only some paths are populated with switches, or that the switching function is integratable into the input fixed matching circuit 510 such that active switching replaces the passive splitting. Additionally alternative embodiments exist wherein the switches are augmented or replaced with switch elements disposed electrically downstream of the amplifiers, before or within the output fixed matching circuit 570.

Figure 6:
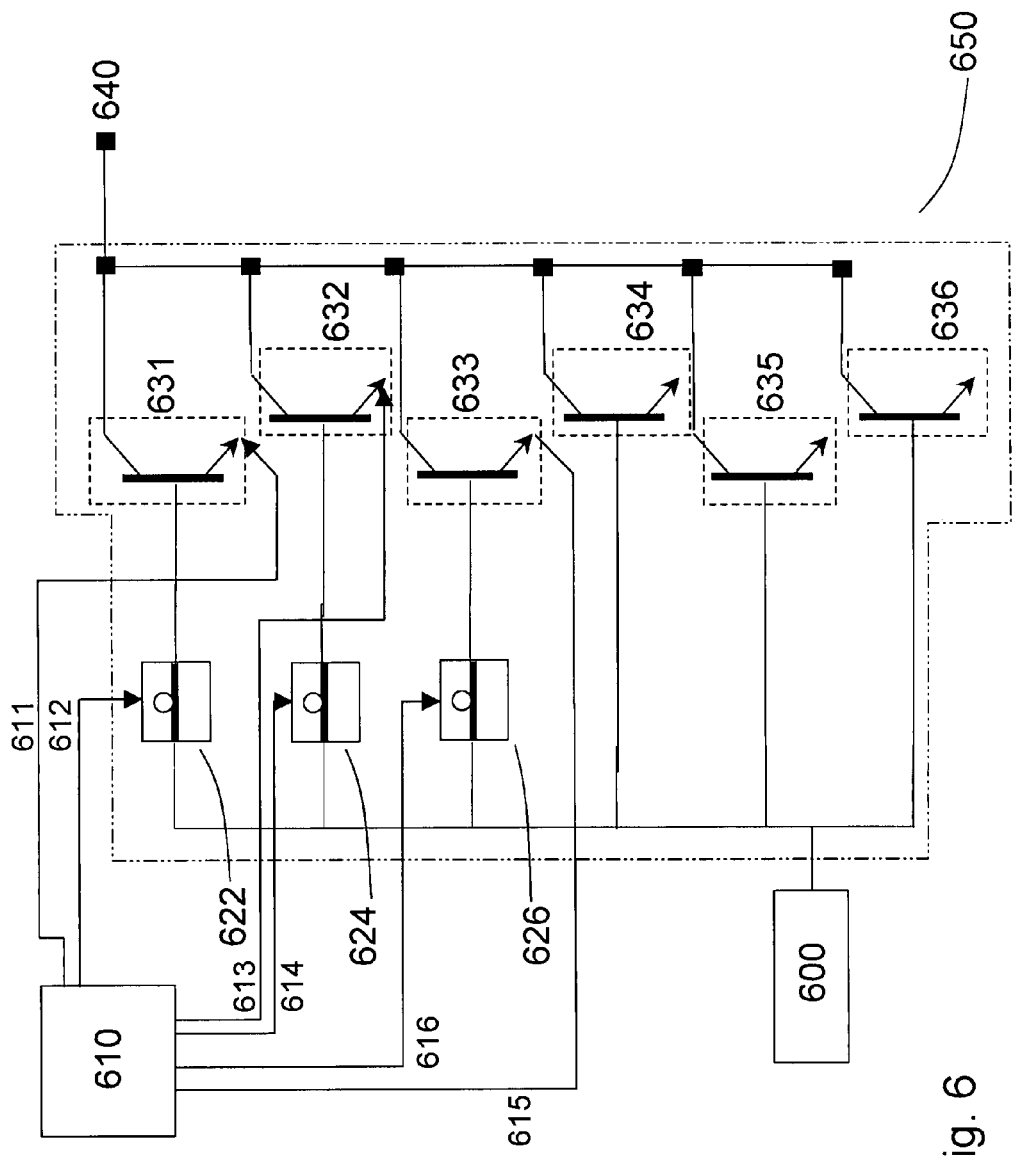
FIG. 6 is a simplified schematic of an exemplary embodiment of dynamic power provisioning within one amplifier of the parallel amplifier paths.

Referring to FIG. 6, shown is a simplified schematic of an exemplary embodiment of dynamic power provisioning within one amplifier path of the parallel amplifier paths. Hereinabove, this process is referred to as varying the effective area of the transistors in the gain stages. Shown is a microwave circuit connection 600, examples of which include the output port of the fixed matching circuit 410 in FIG. 4 or the first switch circuit 530 in FIG. 5. The microwave circuit connection 600 provides a microwave signal into an amplifier gain stage 650 for processing and subsequent coupling to amplifier gain stage output port 640.

The amplifier gain stage 650 comprises transistors 631 to 636, of which transistors 634 to 636 are shown directly coupled between the input port and output port 640 of the amplifier gain stage 650. The remaining transistors are electrically coupled to switch elements 622 to 626. Transistor 631 is electrically coupled to switch element 622, controlled by switch control line 612, which is set from a control block 610. Additionally coupled from the control block 610 is a bias control line 611 to the transistor 631. In this manner the transistor 631 is electrically connected in a first mode of operation and electrically disconnected in a second other mode of operation from the amplifier gain stage 650, thereby changing the effective area of the transistor for providing gain. This allows a low gain current drain to be further reduced without actually turning the amplifier off and slowing the responsiveness of the amplifier gain stage 650.

In a similar manner transistor 632 is coupled to switch 624 and the pair have bias control line 613 and switch control line 614 coupled to control block 610. Transistor 633 is coupled to switch 626 and via bias control line 615 and switch control line 616 to the control block 610. It would be evident to one skilled in the art that alternative configurations are possible, as well as alternative schemes for the dynamic provisioning of effective transistor area is implemented differently.

As outlined in FIGS. 4 and 5, parallel amplifiers comprise a tunable matching circuit, for example element 465 in FIG. 4 and element 565 in FIG. 5. These allow for dynamic adjustment of the output impedance of the parallel amplifier. This is useful for shifting the impedance match between such a tunable matching circuit and the output matching circuit, 470 and 570, within or outside of the frequency band of operation of the amplifier. Advantageously in the "ON" state, wherein the impedance transform provides for matching within the band of interest, refined adjustment of the tunable matching circuit acts to fine tune the impedance matching ensuring maximum power transfer to the final output port while reducing reflections.

Figure 7:
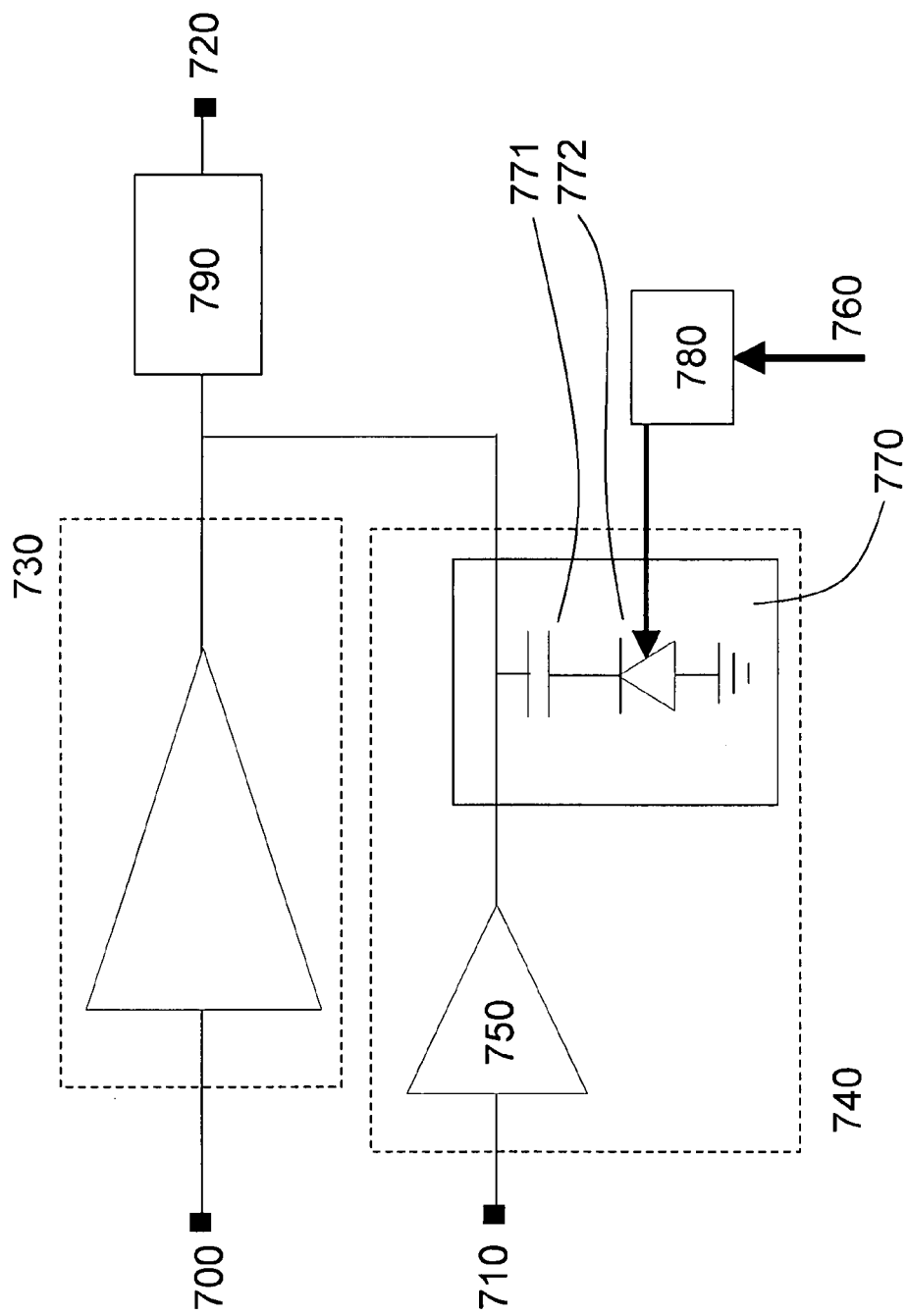
FIG. 7 is a simplified schematic of an exemplary embodiment of a dynamic matching circuit within the parallel amplifier stages providing impedance transform to the output impedance matching and allowing translation of the pole-frequency from in-band to out-of-band.

Referring to FIG. 7, shown is a simplified schematic diagram of an exemplary embodiment of a dynamic impedance matching circuit for use within one of the parallel amplifier stages. Shown are a first parallel amplifier 730, being the first parallel amplifier of such a multi-stage parallel amplifier circuit 70, and a second parallel amplifier 740, the second element of the multi-stage parallel amplifier circuit 70. The first parallel amplifier 730 receives a signal at input port 700 and provides a signal to the output fixed matching circuit 790 with which the first parallel amplifier 730 has an impedance match. The second parallel amplifier receives a signal at input port 710, which is electrically coupled to gain block 750, which provides an amplified version of the signal to the tunable matching circuit 770. The output port of the tunable impedance matching circuit 770 is electrically coupled to the output fixed matching circuit 790.

In one embodiment, the tunable matching circuit 770 comprises a diode 772 and a capacitor 771. The diode 772 is coupled to matching circuit controller 780 and electrical ground. In operation the diode 772 is biased to an operating point such that the overall impedance of the diode 772 and capacitor 771 presents a specified impedance to match the output impedance of the gain block 750 to the output impedance matching circuit 790 within the frequency range or at a predetermined out of band range. Diode 772 is advantageously a varactor diode allowing for monolithic integration of the varactor diode with the amplifier.

It is evident to those skilled in the art that the provision of the appropriate bias to the diode 772 is enabled by selection of the second parallel amplifier 740 as the active parallel amplifier of the full parallel amplifier circuit. Alternatively, matching circuit controller 780 determines actively a bias based upon measurements of reflected power, transmitted power at an output port of the parallel amplifier 720 or other suitable means of defining appropriate matching during operation. In this manner, matching can be static or dynamically adjusted to the actual operating conditions of the parallel amplifier.

Advantageously the tunable matching circuit 770 is useful for setting multiple operating characteristics according to enabled or disabled operation of the parallel amplifier stage. For example, the tunable matching circuit 770 may have multiple regimes, which are selected according to an operation mode of the overall device within which the multi-stage parallel amplifier circuit 70 is incorporated. For example, the second parallel amplifier 740 may be designed for providing an output power range of −20 dBm to +0 dBm, the first primary amplifier 730 may be designed for an output power range of +0 dBm to +30 dBm operation, and the multi-stage parallel amplifier circuit 70 is intended to operate narrowband at two different centre frequencies, for example 1800 MHz or 2.4 GHz. This could result in four operating regimes for the tunable matching circuit 770. These being, one regime wherein the multi-stage parallel amplifier circuit 70 is operating within a regime of output power within the power range of −20 dBm to +0 dBm and the signal being amplified being centered on 1800 MHz, a second wherein the output power range is −20 dBm to +0 dBm but now the signal is centered on 2.4 GHz, a third regime wherein the output power is >+0 dBm and the signal is centered on 1800 MHz, and the fourth regime wherein the output power is >+0 dBm and the signal is centered on 2.4 GHz. As such the tunable matching circuit 760 may advantageously obviate the requirement for the parallel amplifier designer to implement either an expensive broadband matching circuit for each of the first and second parallel amplifiers 730 and 740 respectively, or to implement two additional parallel amplifiers to facilitate the four operating regimes.

It would also be evident to someone skilled in the art that the tunable matching circuit 760 when implemented with appropriate feedback and/or control signals provides for additional adjustments based upon, for example, temperature and power supply variations, the latter for example providing enhanced performance over wider power supply variations which is particularly beneficial in mobile applications. Alternatively, enhanced performance is provided for each of multiple preset power rails allowing operation with different power supplies.

Figure 8:
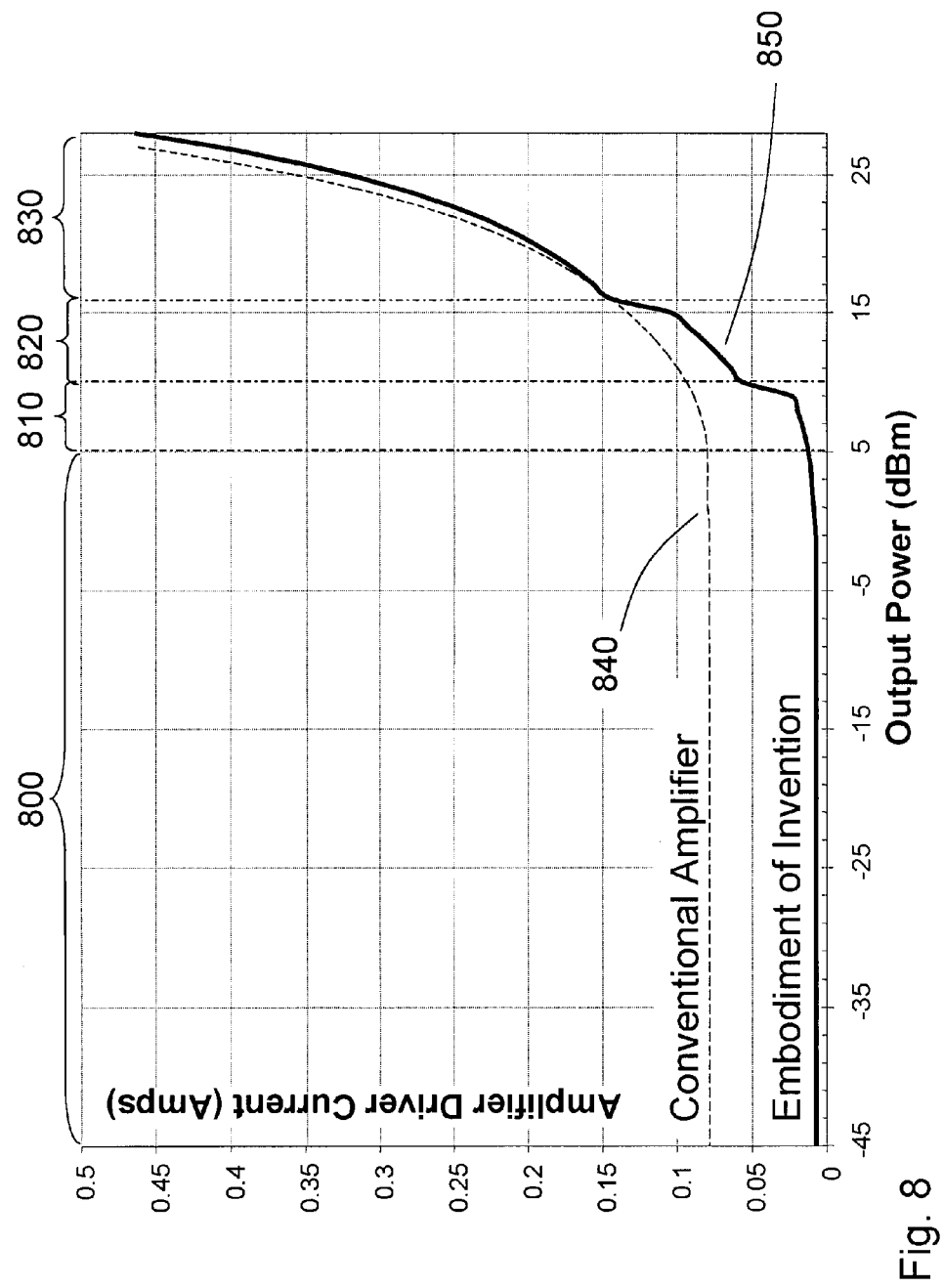
FIG. 8 is an exemplary performance chart of an amplifier operating over wide dynamic range showing the improved performance of an exemplary embodiment of the invention over a conventional prior art amplifier.

FIG. 8 shows performance of an exemplary embodiment of the invention over a conventional prior art amplifier for an amplifier operating over wide dynamic range. The amplifier is designed for low current consumption over a wide dynamic range, although alternative embodiments of amplifiers are also supported for multiple frequency ranges, multiple power bands, and other combinations thereof. Shown is the total drive current applied to the amplifier, shown linearly in amps, as a function of the amplifier output power, plotted logarithmically in dBm. The resulting characteristic performance of a conventional amplifier design is shown by line 840, and the operating characteristic of an exemplary embodiment of the invention is plotted as line 850. In this example the amplifier comprises two amplifier gain stages disposed in parallel, and for discussion four regions of operation, 800 to 830, for the amplifier are discussed below. Considering these regions we find:

Region 1 (830) relies on a primary path of the multiple parallel design—an amplifier allowing optimization of the loading for maximum power efficiency. Additionally switching of the unused amplifier paths via their tunable matching circuits to high impedance, and thereby matching outside of the frequency range of interest, reduces the loading of these unused paths and results in additional efficiency improvements. At +25 dBm the reduction in drive current is from approximately 350 mA to approximately 320 mA, an 8.5% improvement in operating efficiency. For a cellular telephone this can represent an additional 15 minutes talk time on a battery otherwise rated at 3 hours talk time.

Region 2 (820) relies on the secondary path within the amplifier. In a fully integrated circuit embodiment, for example, the secondary path is optionally a resizing of the power stage to improve mid-power efficiency and provide reduced quiescent current. At +13 dBm the reduction in drive current is from approximately 100 mA to approximately 65 mA, a 35% improvement. For a cellular telephone this represents an additional 1-hour of talk time on a battery otherwise rated at 3 hours talk time.

Region 3 (810)—using dynamic switching of the size of the power cell, as outlined in FIG. 6, allows for improvement of the cell periphery for lower power levels, thus improving power added efficiency. For example at +6 dBm the reduction in drive current is from approximately 80 mA to approximately 17 mA, a near 80% improvement.

Region 4 (800)—the amplifier is operating with the combined effects of the switched path, re-sized power cells, and switched load and is able to reduce the quiescent current and still comply with linearity requirements. Now at 0 dBm the reduction in drive current is from approximately 75 mA to approximately 10 mA, an 85% improvement.

Hence, such reductions in power consumption are useful to increase battery lifetime, with improvements in stand-by or quiescent mode being substantial. Alternatively, the reductions in power consumption are used to provide additional features such as color displays, louder sound, and more effective vibration. Also even at high power, improving efficiency allows either the provision of extended operation or the use of smaller and lighter batteries in mobile applications.

Numerous other embodiments may be envisaged without departing from the spirit or scope of the invention.

What is claimed is:

1. A microwave amplifier comprising:
an input port for receiving a variable RF signal for amplification; the variable RF signal comprising signals corresponding to a predetermined set of frequencies;
an output port for providing an amplified version of the variable RF signal therefrom;
a circuit disposed electrically between the input port and the output port for amplifying the variable RF signal, the circuit comprising:
an input fixed impedance matching circuit;
an output fixed impedance matching circuit;
a first amplifier disposed electrically between the input fixed impedance matching circuit and the input impedance port of the output fixed impedance matching circuit, the first amplifier comprising a front port for receiving at least a portion of the variable RF signal, a back port for providing an amplified version of the at least a portion of the variable RF signal, and a first gain circuit for providing an amplification of the at least a portion of the variable RF signal;
at least one of a plurality of second amplifiers disposed electrically between the input fixed impedance matching circuit and output fixed impedance matching circuit, said plurality of second amplifiers other than in series with the first amplifier, each of the plurality of second amplifiers comprising a first port for receiving at least a portion of the variable RF signal, a second port for providing an amplified version of the at least a portion of the variable RF signal, a second gain circuit for providing an amplification of the at least a portion of the variable RF signal, and a tunable impedance matching circuit for providing a transformation of impedance from the output impedance of the output port of the second amplifier to the impedance of the input impedance port of the output fixed impedance matching circuit.

2. A microwave amplifier according to claim 1 wherein,
the tunable impedance matching circuit is biased to a first impedance state wherein the transformation of impedance matches between the impedance of the second amplifier and the output fixed impedance matching circuit when the second amplifier is in operation; and,
is biased to a second impedance state wherein the transformation of impedance other than matches between the impedance of the second amplifier and the output fixed impedance matching circuit when the second amplifier is other than in operation.

3. A microwave amplifier according to claim 2 wherein,
the first impedance state results in an impedance match at the predetermined frequencies between the second amplifier and the output impedance matching circuit.

4. A microwave amplifier according to claim 2 wherein,
the second impedance state results in other than an impedance match at the predetermined frequencies between the second amplifier and the output impedance matching circuit.

5. A microwave amplifier according to claim 2 wherein,
the second impedance state results in a pole frequency of the impedance match between the second amplifier and the output impedance matching circuit being other than at the predetermined set of frequencies.

6. A microwave amplifier according to claim 1 wherein
the tunable matching circuit comprises a tuning control port, the tuning control port for receiving a tuning control signal, wherein,
the transformation of impedance is determined by at least the tuning control signal.

7. A microwave amplifier according to claim 5 wherein,
the transformation of impedance is at least one of continuous range of transformation of impedance and a discrete series of transformations of impedance.

8. A microwave amplifier according to claim 5 wherein,
the tuning control signal is determined by at least one of an operating mode of the microwave amplifier, a first characteristic of the second amplifier, a second characteristic of the variable RF signal, and a third characteristic of the amplified variable RF signal.

9. A microwave amplifier according to claim 8 wherein,
the second and third characteristics are at least one of frequency, modulation format, and power.

10. A microwave amplifier according to claim 9 wherein,
the first characteristic is at least one of gain, transistor configuration and temperature.

11. A microwave amplifier according to claim 1 wherein,
the tunable impedance matching circuit comprises at least a tunable impedance element.

12. A microwave amplifier according to claim 1 wherein,
the tunable impedance matching circuit comprises at least a variable capacitance diode.

13. A microwave amplifier according to claim 10 wherein,
the variable capacitance diode is fabricated using at least one of Si CMOS, SiGe CMOS, GaAs and InP semiconductor technology platforms.

14. A microwave amplifier according to claim 1 wherein,
the tunable impedance matching circuit comprises at least an integrated PIN diode, the PIN diode for switching at least electrically coupling and decoupling a capacitor.

15. A microwave amplifier according to claim 14 wherein,
the integrated PIN diode is fabricated using at least one of Si CMOS, SiGe CMOS, GaAs and InP semiconductor technology platforms.

16. A microwave amplifier according to claim 1 wherein,
the tunable impedance matching circuit comprises at least a FET, the FET for at least electrically coupling and decoupling a capacitor.

17. A microwave amplifier according to claim 16 wherein,
the FET is fabricated using at least one of Si CMOS, SiGe CMOS, GaAs and InP semiconductor technology platforms.

18. A microwave amplifier according to claim 1 wherein,
the tunable impedance matching circuit comprises a MEMs based variable capacitor, the MEMS based variable capacitor for providing a variable capacitance.

19. A microwave amplifier according to claim 18 wherein,
the MEMs based variable capacitor is fabricated using at least one of Si CMOS, SiGe CMOS, GaAs and InP semiconductor technology platforms.

20. A microwave amplifier according to claim 1 wherein,
at least one of the plurality of second amplifiers further comprises a first electrical switching element disposed at one of the first port and second port of the at least one of a plurality of second amplifiers.

21. A microwave amplifier according to claim 11 wherein, the first electrical switching element is at least one an electrical switch and a transistor.

22. A microwave amplifier according to claim 11 wherein,
the first electrical switching element is in an electrically closed state when the at least one of a plurality of second amplifiers is in operation, and,
in an electrically open state when the at least one of a plurality of second amplifiers is other than in operation.

23. A microwave amplifier according to claim 11 wherein,
the at least one of a plurality of second amplifiers further comprises a second switching element, the second electrical switching element being disposed at the other of the first port and second port of the at least one of a plurality of second amplifiers, and being in an electrically closed state when the at least one of a plurality of second amplifiers is in operation, and in an electrically open state when the at least one of a plurality of second amplifiers is other than in operation.

24. A microwave amplifier according to claim 1 wherein,
the first amplifier further comprises a first electrical switching element disposed at one of the front port and back port of the first amplifier.

25. A microwave amplifier according to claim 14, wherein
the first electrical switching element is in an electrically closed state when the first amplifier is in operation, and in an electrically open state when the first amplifier is other than in operation.

26. A microwave amplifier according to claim 14, wherein
the first amplifier further comprises a second switching element,
the second electrical switching element being disposed at the other of the front port and back port of the first amplifier, and
being in an electrically closed state when the at least one of a plurality of second amplifiers is in operation and in an electrically open state when the at least one of a plurality of second amplifiers is other than in operation.

27. A method of amplifying a variable RF signal comprising the following steps:
(i) providing a first amplifier circuit for performing a first amplification function and responsive to at least a first control signal, the first amplifier circuit having a first operating characteristic, an input fixed impedance matching circuit, an output fixed impedance matching circuit, and a first gain stage disposed electrically between the input fixed impedance matching circuit and output fixed impedance matching circuit;
(j) providing at least of a plurality of second amplifier circuits, each of the plurality of second amplifier circuits for performing a second amplification function and responsive to at least a second control signal and an impedance control signal, the second amplifier circuit having a second operating characteristic, a second gain stage and a tunable impedance matching circuit; wherein the second gain stage is disposed electrically between the input fixed impedance matching circuit and output fixed impedance matching circuit, and the tunable impedance matching circuit for providing a transformation of impedance from the second amplifier to the impedance of output fixed impedance matching circuit.
(k) providing the variable RF signal to an input port of the input fixed impedance matching circuit, the variable RF signal comprising signals corresponding to a predetermined set of frequencies;
(l) determining the one of first amplifier circuit and one of the plurality of second amplifier circuits being in operation;
(m) providing to the first amplifier circuit at least a first control signal when the first amplifier circuit is in operation, and other than a first control signal when the first amplifier circuit is other than in operation;

(n) providing to each second amplifier circuit of the plurality of second amplifier circuit at least a second control signal when the second amplifier circuit is in operation, and other than a second control signal when the second amplifier circuit is other than in operation;

(o) providing to each second amplifier circuit a first impedance control signal when the second amplifier circuit is in operation, and a second impedance control signal when the second amplifier circuit is other than in operation, and (p) generating an amplified variable RF signal at an output port of the output fixed impedance matching circuit, the amplified variable RF signal being related to the variable RF signal and at least one of the first operating characteristic and second operating characteristic.

28. A method according to claim 27 wherein,
providing the tunable impedance matching circuit results in providing at least a first transformation of impedance between the impedance of the second amplifier and the output fixed impedance matching circuit when the second amplifier is in operation and a second transformation of impedance between the impedance of the second amplifier and the output fixed impedance matching circuit when the second amplifier is other than in operation.

29. A method according to claim 28, wherein,
the first transformation of impedance provides an impedance match at the predetermined frequencies between the second amplifier and the output impedance matching circuit.

30. A method according to claim 28 wherein,
the second transformation of impedance provides other than an impedance match at the predetermined frequencies between the second amplifier and the output impedance matching circuit.

31. A method according to claim 28 wherein,
the second transformation of impedance results in a pole frequency of the impedance match between the second amplifier and the output impedance matching circuit being other than at the predetermined set of frequencies.

32. A method according to claim 27, wherein
providing the tunable matching circuit comprises providing a tuning control port, the tuning control port for receiving a tuning control signal.

33. A method according to claim 32 wherein,
the tuning control signal for determining the transformation of impedance.

34. A method according to claim 32 wherein,
the tunable matching circuit provides for at least one of a continuous range of transformation of impedance and a discrete series of transformations of impedance.

35. A method according to claim 32 wherein,
providing the tuning control signal is based upon at least determining one of an operating mode of the microwave amplifier, a first amplifier characteristic of the second amplifier, a first signal characteristic of the variable RF signal, and a first signal characteristic of the amplified variable RF signal.

36. A method according to claim 35 wherein,
determining the first characteristic comprises determining at least one of frequency, modulation format, and RF power.

37. A method according to claim 36 wherein,
determining the first amplifier characteristic comprises at least determining one of gain, transistor configuration and temperature.

38. A method according to claim 27 wherein,
providing the tunable impedance matching circuit comprises providing at least a tunable impedance element.

39. A method according to claim 27 wherein,
providing the tunable impedance matching circuit comprises providing at least a variable capacitance diode.

40. A method according to claim 39 wherein,
providing the variable capacitance diode comprises manufacturing the variable capacitance diode using at least one of Si, Si CMOS, SiGe CMOS, GaAs and In P semiconductor technology platforms.

41. A method according to claim 27 wherein,
providing the tunable impedance matching circuit comprises providing at least an integrated PIN diode, the PIN diode for switching at least electrically coupling and decoupling at least one of a resistor, capacitor and inductor.

42. A method according to claim 41 wherein,
providing the integrated PIN diode comprises manufacturing the integrated PIN diode using at least one of Si, Si CMOS, SiGe CMOS, GaAs and InP semiconductor technology platforms.

43. A method according to claim 27 wherein,
providing the tunable impedance matching circuit comprises providing at least a FET, the FET for at least electrically coupling and decoupling at least one of a resistor, capacitor and inductor.

44. A method according to claim 43 wherein,
providing the FET comprises manufacturing the FET using at least one of Si, Si CMOS, SiGe CMOS, GaAs and InP semiconductor technology platforms.

45. A method according to claim 27 wherein,
providing the tunable impedance matching circuit comprises providing a MEMs based variable capacitor, the MEMS based variable capacitor providing a variable capacitance.

46. A method according to claim 45 wherein,
providing the MEMs based variable capacitor comprises manufacturing the MEMS based variable by at least one of Si, Si CMOS, SiGe CMOS, GaAs and InP semiconductor technology platforms.

47. A method according to claim 27 wherein,
providing at least one of the plurality of second amplifiers comprises providing at least a first electrical switching element, the first electrical switching element for at least electrically coupling and electrically decoupling the one of the plurality of second amplifiers.

48. A method according to claim 47 wherein;
providing the first electrical switching element is by providing at least one an electrical switch and a transistor.

49. A method according to claim 47 wherein,
electrically coupling and electrically decoupling is determined in step (d).

50. A method according to claim 49 wherein,
electrical coupling is provided in response to determining that the one of a plurality of second amplifiers is to be operating, and electrical decoupling is provided in response to the determining that the one of a plurality of second amplifiers is to be other than operating.

51. A method according to claim 27 wherein,
providing the first amplifier comprises providing at least a first electrical switching element, the first electrical switching element for at least electrically coupling and electrically decoupling the first amplifier.

52. A method according to claim 51 wherein;
providing the first electrical switching element is by providing at least one an electrical switch and a transistor.

53. A method according to claim 51 wherein,
electrically coupling and electrically decoupling is determined in step (d).

54. A method according to claim 53 wherein,
electrical coupling is provided in response to determining that the first amplifier is to be operating, and electrical decoupling is provided in response to the determining that the first amplifier is to be other than operating.

55. A computer readable medium having stored therein data according to a predetermined computing device format, and upon execution of the data by a suitable computing device a design procedure for providing a design of a microwave amplifier is provided, comprising:
  an input port for receiving a variable RF signal for amplification; the variable RF signal comprising signals corresponding to a predetermined set of frequencies;
  an output port for providing an amplified version of the variable RF signal therefrom;
  a circuit disposed electrically between the input port and the output port for amplifying the variable RF signal, the circuit comprising:
    an input fixed impedance matching circuit;
    an output fixed impedance matching circuit;
    a first amplifier disposed electrically between the input fixed impedance matching circuit and the input impedance port of the output fixed impedance matching circuit, the first amplifier comprising a front port for receiving at least a portion of the variable RF signal, a back port for providing an amplified version of the at least a portion of the variable RF signal, and a first gain circuit for providing an amplification of the at least a portion of the variable RF signal;
    at least one of a plurality of second amplifiers disposed electrically between the input fixed impedance matching circuit and output fixed impedance matching circuit, said plurality of second amplifiers other than in series with the first amplifier, each of the plurality of second amplifiers comprising a first port for receiving at least a portion of the variable RF signal, a second port for providing an amplified version of the at least a portion of the variable RF signal, a second gain circuit for providing an amplification of the at least a portion of the variable RF signal, and a tunable impedance matching circuit for providing a transformation of impedance from the output impedance of the output port of the second amplifier to the impedance of the input impedance port of the output fixed impedance matching circuit.

56. A computer readable medium according to claim 55 wherein,
at least one of the plurality of second amplifiers comprises at least a first electrical switching element disposed at one of the first port and second port of the at least one of a plurality of second amplifiers.

57. A computer readable medium according to claim 55 wherein,
the first amplifier comprises at least a first electrical switching element disposed at one of the input port and output port of the first amplifier.

58. A computer readable medium according to claim 55 wherein,
the tunable impedance matching circuit comprises at least a tunable impedance element.

* * * * *